(12) United States Patent
Li (10) Patent No.: US 10,008,154 B2
(45) Date of Patent: Jun. 26, 2018

(54) GATE DRIVING CIRCUIT AND OLED DISPLAY DEVICE

(71) Applicant: BOE TECHNOLOGY GROUP CO., LTD., Beijing (CN)

(72) Inventor: Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 114 days.

(21) Appl. No.: 15/139,635

(22) Filed: Apr. 27, 2016

(65) Prior Publication Data

US 2016/0351128 A1 Dec. 1, 2016

(30) Foreign Application Priority Data

May 29, 2015 (CN) .......................... 2015 1 0289143

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0426* (2013.01); *G09G 2310/0286* (2013.01); *G09G 2310/0291* (2013.01); *G09G 2320/0233* (2013.01)

(58) Field of Classification Search
None
See application file for complete search history.

(56) References Cited

U.S. PATENT DOCUMENTS

| | | | | |
|---|---|---|---|---|
| 2011/0285752 A1* | 11/2011 | Park | ...................... | G09G 3/3225 345/690 |
| 2012/0081409 A1* | 4/2012 | Chung | .................. | G09G 3/3266 345/690 |
| 2012/0098826 A1* | 4/2012 | Lee | .......................... | G09G 3/003 345/419 |
| 2012/0188290 A1* | 7/2012 | Park | ...................... | G09G 3/3266 345/690 |
| 2015/0002377 A1* | 1/2015 | Liu | ........................ | G09G 3/3258 345/77 |
| 2015/0015554 A1* | 1/2015 | Kim | ...................... | G09G 3/3208 345/208 |

(Continued)

*Primary Examiner* — Claire X Pappas
*Assistant Examiner* — Benjamin Casarez
(74) *Attorney, Agent, or Firm* — Nath, Goldberg & Meyer; Joshua B. Goldberg (57) ABSTRACT

The present invention provides a gate driving circuit and an OLED display device. The gate driving circuit comprises multiple stages of shift registers, each stage of shift register is connected to an inverter and provides a first signal and a second signal for the inverter; the inverter receives the first signal and the second signal and generates a light emitting signal according to the first signal and the second signal and input the light emitting signal to the light emitting device; the inverter comprises at least two current amplification units and an external pull-down unit; each current amplification unit comprises a pull-up module, a pull-up hold module, an internal pull-down module and a driving transistor. According to the present invention, the number of transistors can be reduced, the aperture ratio of the display device is improved, and output with high voltage and large current can be provided.

20 Claims, 6 Drawing Sheets

(56) References Cited

U.S. PATENT DOCUMENTS

| | | | |
|---|---|---|---|
| 2015/0061982 A1* | 3/2015 | Woo | G09G 3/3266 |
| | | | 345/82 |
| 2015/0138180 A1* | 5/2015 | Park | G09G 3/3233 |
| | | | 345/212 |
| 2016/0005359 A1* | 1/2016 | Kwon | G09G 3/3266 |
| | | | 345/213 |
| 2016/0042691 A1* | 2/2016 | Na | G09G 3/3266 |
| | | | 345/205 |
| 2016/0049116 A1* | 2/2016 | Cao | G09G 3/3258 |
| | | | 345/213 |
| 2016/0055829 A1* | 2/2016 | Lin | G09G 3/3233 |
| | | | 345/213 |
| 2016/0141352 A1* | 5/2016 | Sung | G09G 3/3266 |
| | | | 257/40 |
| 2017/0025057 A1* | 1/2017 | Li | G09G 3/2092 |
| 2017/0116925 A1* | 4/2017 | Lee | G09G 3/3266 |
| 2017/0193921 A1* | 7/2017 | Sung | G09G 3/3258 |

* cited by examiner

GATE DRIVING CIRCUIT AND OLED DISPLAY DEVICE

FIELD OF THE INVENTION

The present invention relates to the field of display technology, and particularly relates to a gate driving circuit and an OLED display device.

BACKGROUND OF THE INVENTION

In the OLED display device, current for driving the light emitting device to emit light is affected by drift of the threshold voltage of the driving transistor, thereby the brightness during display will change and the display effect is affected.

In existing solutions, typically a compensation module for compensating the threshold voltage of the driving transistor is incorporated in the gate driving circuit of an OLED display device, so as to improve brightness uniformity of the display device during display. In these solutions, generally a plurality of thin film transistors and/or capacitors is included in the compensation module, which reduces the aperture ratio of the display device.

Besides above manner, a so-called Scan Power, in which AC signal is used as power signal (VDD) for the gate driving circuit, can be adopted. In this manner, the number of thin film transistors and/or capacitors is not increased, thereby the aperture ratio of the display device can be improved compared to above manner.

However, in a gate driving circuit formed by N-type thin film transistor, due to limitation of characteristics of the N-type thin film transistor, it is difficult to provide direct output of AC signal VDD, therefore it is difficult to adopt the above-described Scan Power technology to compensate threshold voltage of the driving transistors.

SUMMARY OF THE INVENTION

The present invention is directed to solve at least one of the technical problems in the prior art, and provides a gate driving circuit and an OLED display device which have reduced number of thin film transistors and/or capacitors, and can provide output with high voltage and large current.

To achieve above objects, the present invention provides a gate driving circuit comprising multiple stages of shift registers, each stage shift register is connected to an inverter; the shift register is configured to provide a first signal and a second signal for the inverter, when the first signal is high level, the second signal is low level, and when the first signal is low level, the second signal is high level; the inverter receives the first signal and the second signal, an output terminal of the inverter is connected to an anode of a light emitting device, the inverter is configured to generate a light emitting signal according to the first signal and the second signal and input the light emitting signal to the light emitting device, so as to drive the light emitting device to emit light; the inverter comprises at least two current amplification units and an external pull-down unit; each current amplification unit comprises a pull-up module, a pull-up hold module, an internal pull-down module and a driving transistor; within each current amplification unit, the pull-up module and the pull-up hold module are connected to a gate of the driving transistor, the pull-up module receives the first signal and is configured for pulling up potential of the light emitting signal; the pull-up hold module is connected to the gate of the driving transistor, and is configured for holding potential of the light emitting signal at a pulled-up state; the internal pull-down module is connected to the gate of the driving transistor, the internal pull-down module receives the second signal and is configured for pulling down potential of the pull-up hold module; a source of the driving transistor is connected to a high voltage terminal, and a drain of the driving transistor is connected to an output terminal; the external pull-down unit is connected to the output terminal, the external pull-down unit receives the second signal and is configured for pulling down potential of the light emitting signal.

Optionally, each current amplification unit is connected with a pull-up node and a pull-down node of the shift register, the external pull-down unit is connected to the pull-up node of the shift register; the first signal is supplied to the current amplification unit through the pull-down node, the second signal is supplied to the current amplification unit and the external pull-down unit through the pull-up node.

Optionally, in the inverter, the number of the current amplification units is an even number, every two current amplification units correspond to each other.

Alternatively, in the inverter, the number of the current amplification units is an odd number, wherein at least two current amplification units correspond to each other.

Optionally, in each current amplification unit, the pull-up module comprises transistors a and b; the gate of the transistor a is connected to the first signal, the source of the transistor a is connected to a clock signal terminal, the drain of the transistor a is connected to the gate and source of the transistor b; the drain of the transistor b is connected with the pull-up hold module in the current amplification unit and the gate of the driving transistor; in two current amplification units corresponding to each other, the sources of transistors a are connected to different clock signal terminals, and when one clock signal terminal provides low level, the other clock signal terminal provides high level.

Optionally, in each current amplification unit, the pull-up hold module comprises a transistor c and a capacitor C; the gate of the transistor c is connected to the drain of the transistor b, the source of the transistor c is connected to a clock signal terminal, and the drain of the transistor c is connected to a first terminal of the capacitor C; a second terminal of the capacitor C is connected between the drain of the transistor b and the gate of the transistor c; in each current amplification unit, the clock signal terminal connected with the source of the transistor c is different from the clock signal terminal connected with the source of the transistor a, and when one of the two clock signal terminals provides low level, the other clock signal terminal provides high level.

Optionally, in each current amplification unit, the internal pull-down module comprises a transistor d; the gate of the transistor d is connected to the second signal, the source of the transistor d is connected to a low voltage terminal, and the drain of the transistor d is connected between the gate of the transistor c and the second terminal of the capacitor C.

Optionally, the external pull-down unit comprises a transistor e; the gate of the transistor e is connected to the second signal, the source of the transistor e is connected to the low voltage terminal, the drain of the transistor e is connected to the output terminal.

Optionally, in every two current amplification units corresponding to each other, the clock signal terminal connected to the source of the transistor a in one current amplification unit is the same as the clock signal terminal connected to the source of the transistor c in the other current amplification unit.

Optionally, the number of the current amplification units in the inverter is two.

Preferably, the number of the current amplification units in the inverter is four.

Optionally, all of the transistors are N-type thin film transistors.

Optionally, the shift register comprises a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor, an eighteenth transistor, a twenty-seventh transistor and a bootstrap capacitor; the gate and source of the fifteenth transistor are connected with a first control voltage terminal, the drain of the fifteenth transistor is connected with the source of the sixteenth transistor; the gate of the sixteenth transistor is connected with the first clock signal terminal, the drain of the sixteenth transistor is connected with the pull-up node; the gate and source of the eleventh transistor are connected with the first clock signal terminal, the drain of the eleventh transistor is connected with the pull-down node; the gate and source of the twenty-seventh transistor are connected with the second clock signal terminal, the drain of the twenty-seventh transistor is connected with the pull-down node; the gate of the eighteenth transistor is connected with the pull-down node, the source of the eighteenth transistor is connected with the first low voltage terminal, the drain of the eighteenth transistor is connected with the source of the thirteenth transistor; the gate of the thirteenth transistor is connected with the pull-down node, the drain of the thirteenth transistor is connected with the pull-up node; the gate of the seventeenth transistor is connected with a second control voltage terminal, the source of the seventeenth transistor is connected with the first low voltage terminal, the drain of the seventeenth transistor is connected with the source of the fourteenth transistor; the gate of the fourteenth transistor is connected with the second control voltage terminal, the drain of the fourteenth transistor is connected with the pull-up node; the gate of the twelfth transistor is connected with the pull-up node, the source of the twelfth transistor is connected with the first low voltage terminal, the drain of the twelfth transistor is connected with the pull-down node; the gate of the eighth transistor is connected with the pull-up node, the source of the eighth transistor is connected with the second clock signal terminal, and the drain of the eighth transistor is connected with the gate of the tenth transistor; the gate of the ninth transistor is connected with the pull-down node, the source of the ninth transistor is connected with the first low voltage terminal, and the drain of the ninth transistor is connected with the gate of the tenth transistor; the gate of the seventh transistor is connected with the pull-up node, the source of the seventh transistor is connected with the second clock signal terminal, and the drain of the seventh transistor is connected with the source of the tenth transistor; the gate of the sixth transistor is connected with the pull-down node, the source of the sixth transistor is connected with the second low voltage terminal, and the drain of the sixth transistor is connected with the source of the tenth transistor; the gate of the fifth transistor is connected with the pull-up node, the source of the fifth transistor is connected with the second clock signal terminal; the gate of the fourth transistor is connected with the pull-down node, the source of the fourth transistor is connected with the second low voltage terminal; the drain of the tenth transistor is connected between the drain of the eighteenth transistor and the source of the thirteenth transistor, and also between the drain of the seventeenth transistor and the source of the fourteenth transistor; a first terminal of the bootstrap capacitor is connected to the pull-up node, a second terminal of the self-lift capacitor is connected to the drain of the twenty-seventh transistor.

Optionally, the shift register further comprises an output terminal which is connected with the drain of the fourth transistor and the drain of the fifth transistor and is empty.

In another aspect, the present invention provides an OLED display device comprising the gate driving circuit described above.

The present invention provides the following advantageous effects. According to the gate driving circuit of the present invention, each stage shift register is connected with an inverter, the inverter generates light emitting signals according to the first signal and the second signal provided by the shift register, to drive the light emitting device to emit light. During this procedure, AC power supply signal can be adopted to compensate the threshold voltage of the driving transistor. Compared to existing solutions, the number of required thin film transistors and/or capacitors is reduced, and the aperture ratio of the display device is improved. Furthermore, since high level and large current is input to the light emitting device by the gate driving circuit of the present invention, output with high voltage and large current can be provided.

According to the OLED display device of the present invention which comprising the gate driving circuit in above embodiments, compared to existing solutions, the number of required thin film transistors and/or capacitors is reduced, and the aperture ratio of the display device is improved. Furthermore, output with high voltage and large current can be provided.

BRIEF DESCRIPTION OF THE DRAWINGS

The drawings, as a part of the specification, are provided for further understanding of the present invention. The drawings and the following embodiments are used to explain the present invention but are not intended to limit the present invention. In the drawings.

REFERENCE NUMERALS

1: shift register; 2: inverter; 20: current amplification unit; 21: external pull-down unit; 201: pull-up module; 202: pull-up hold module; 203: internal pull-down module; 204: driving transistor.

DETAILED DESCRIPTION OF THE EMBODIMENTS

Hereinafter the specific embodiments of the present invention will be described in detail with reference to the drawings. The specific embodiments described herein are only intended to illustrate and explain the present invention and are not intended to limit the invention.

Figure 1:
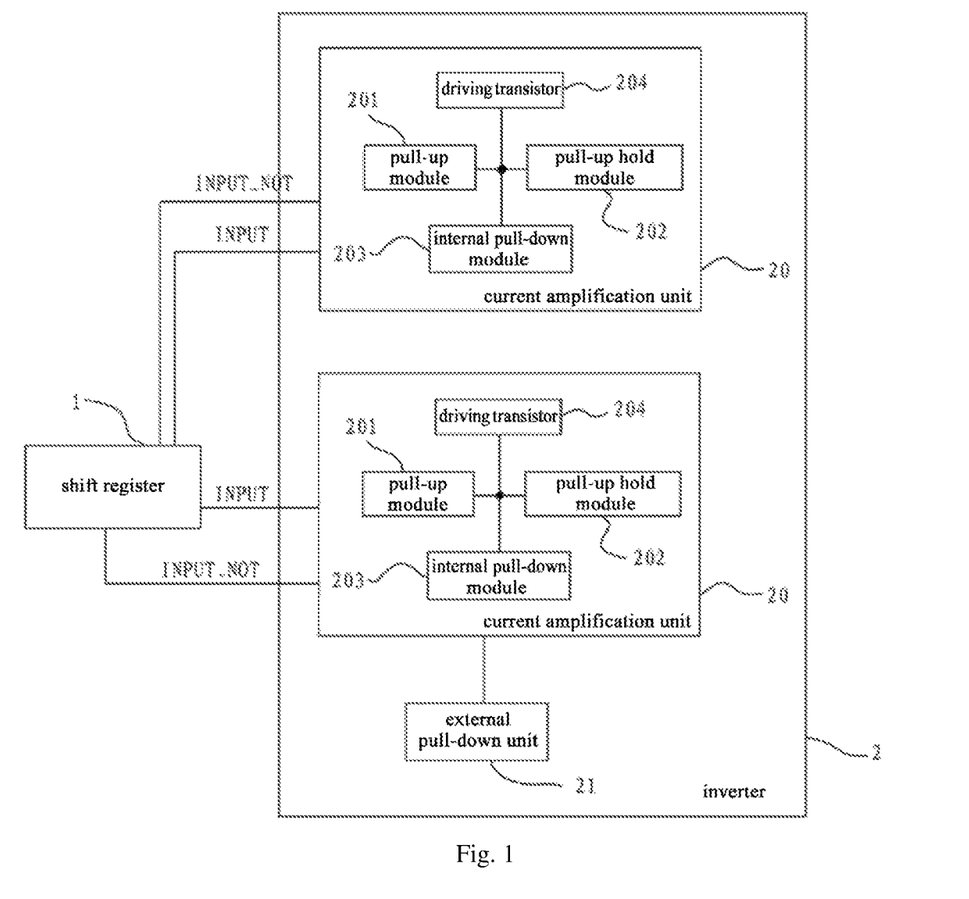
FIG. 1 is a schematic view of a structure of a gate driving circuit according to an embodiment of the present invention.

The present invention provides an embodiment of a gate driving circuit. FIG. 1 is a schematic view of a structure of a gate driving circuit according to an embodiment of the present invention. As shown in FIG. 1, in the present embodiment, the gate driving circuit comprises multiple stages of shift registers 1, each stage shift register 1 is connected to an inverter 2; the shift register 1 is configured to provide a first signal INPUT_NOT and a second signal INPUT for the inverter 2, when the first signal INPUT_NOT is high level, the second signal INPUT is low level, and when the first signal INPUT_NOT is low level, the second signal INPUT is high level. The inverter 2 receives the first signal INPUT_NOT and the second signal INPUT, an output terminal OUT of the inverter 2 is connected to an anode of a light emitting device, the inverter 2 is configured to generate a light emitting signal according to the first signal INPUT_NOT and the second signal INPUT and input the light emitting signal to the light emitting device, so as to drive the light emitting device to emit light.

The inverter 2 comprises at least two current amplification units 20 and an external pull-down unit 21. Each current amplification unit 20 comprises a pull-up module 201, a pull-up hold module 202, an internal pull-down module 203 and a driving transistor 204. Specifically, within each current amplification unit 20, the pull-up module 201 and the pull-up hold module 202 are connected to a gate of the driving transistor 204, the pull-up module 201 receives the first signal INPUT_NOT and is configured for pulling up potential of the light emitting signal. The pull-up hold module 202 is connected to the gate of the driving transistor 204, and is configured for holding potential of the light emitting signal at a pulled-up state. The internal pull-down module 203 is connected to the gate of the driving transistor 204, the internal pull-down module 203 receives the second signal INPUT and is configured for pulling down potentials of the pull-up hold module 202 and the gate of the driving transistor 204. A source of the driving transistor 204 is connected to a high voltage terminal, and a drain of the driving transistor 204 is connected to an output terminal. The external pull-down unit 21 is connected to the output terminal, the external pull-down unit 21 receives the second signal INPUT and is configured for pulling down potential of the light emitting signal.

In the gate driving circuit of the present embodiment, each stage shift register 1 is connected with an inverter 2, the inverter 2 generates a light emitting signal according to the first signal and the second signal provided by the shift register 1, to drive the light emitting device to emit light. During this procedure, AC power supply signal can be adopted to compensate the threshold voltage of the driving transistor. Compared to existing solutions, the number of required thin film transistors and/or capacitors is reduced, and the aperture ratio of the display device is improved. Furthermore, since high level and large current are input to the light emitting device by the gate driving circuit of the present embodiment, output with high voltage and large current can be provided.

Specifically, each current amplification unit 20 is connected with a pull-up node and a pull-down node of the shift register 1, the external pull-down unit 21 is connected to the pull-up node of the shift register 1; the first signal INPUT_NOT is supplied to the current amplification unit 20 through the pull-down node, the second signal INPUT is supplied to the current amplification unit 20 and the external pull-down unit 21 through the pull-up node.

Note that the first signal INPUT_NOT and the second signal INPUT are not necessarily provided through the pull-down node and the pull-up node of the shift register 1 respectively. The current amplification unit 20 and the external pull-down unit 21 can be connected with other nodes or locations in the shift register 1, as long as such nodes or locations being capable of providing the first signal INPUT_NOT and the second signal INPUT required by the inverter 2.

Figure 2:
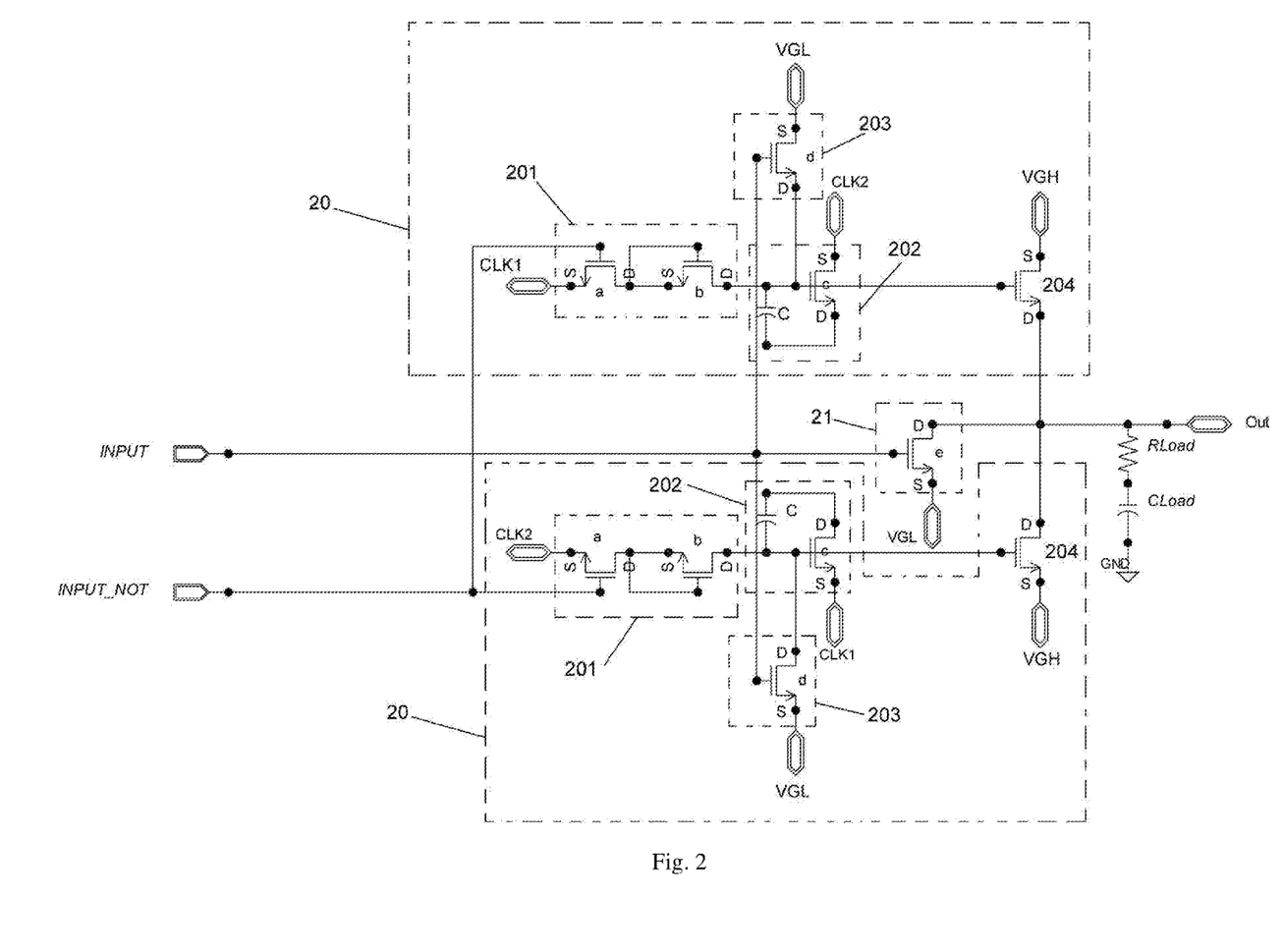
FIG. 2 is a circuit diagram of an inverter in the gate driving circuit shown in FIG. 1.

In the inverter 2, the number of the current amplification units 20 is an even number, every two current amplification units 20 correspond to each other. As shown in FIG. 2, in each current amplification unit 20, the pull-up module 201 comprises transistors a and b; the gate of the transistor a is connected to the first signal INPUT_NOT, the source of the transistor a is connected to a clock signal terminal, the drain of the transistor a is connected to the gate and source of the transistor b; the drain of the transistor b is connected with the pull-up hold module 202 in the current amplification unit 20 and the gate of the driving transistor 204. In two current amplification units 20 corresponding to each other, the sources of transistors a are connected to different clock signal terminals (for example in FIG. 2, the sources of transistors a in two current amplification units 20 are connected to the clock signal terminals CLK1, CLK2 respectively), and when one clock signal terminal provides low level, the other clock signal terminal provides high level.

In each current amplification unit 20, the pull-up hold module 202 comprises a transistor c and a capacitor C; the gate of the transistor c is connected to the drain of the transistor b, the source of the transistor c is connected to a clock signal terminal, and the drain of the transistor c is connected to a first terminal of the capacitor C; the second terminal of the capacitor C is connected between the drain of the transistor b and the gate of the transistor c; and in each current amplification unit 20, the clock signal terminal connected with the source of the transistor c is different from the clock signal terminal connected with the source of the transistor a (for example in a current amplification unit 20 shown in FIG. 2, the source of the transistor c is connected to the clock signal terminal CLK2, while the source of the transistor a is connected to the clock signal terminal CLK1), and when one of the two clock signal terminals provides low level, the other clock signal terminal provides high level.

In each current amplification unit 20, the internal pull-down module 203 comprises a transistor d; the gate of the transistor d is connected to the second signal INPUT, the source of the transistor d is connected to a low voltage terminal, and the drain of the transistor d is connected between the gate of the transistor c and the second terminal of the capacitor C.

In the present embodiment, the external pull-down unit 21 comprises a transistor e; the gate of the transistor e is connected to the second signal INPUT, the source of the transistor e is connected to the low voltage terminal, the drain of the transistor e is connected to the output terminal OUT.

Preferably, in every two current amplification units 20 corresponding to each other, a clock signal terminal connected to the source of the transistor a in one current amplification unit 20 is the same as the clock signal terminal connected to the source of the transistor c in the other current amplification unit 20. For example as shown in FIG. 2, in one current amplification unit 20, the source of the transistor a is connected to the clock signal terminal CLK1, the source of the transistor c is connected to the clock signal terminal CLK2; while in the other current amplification unit 20 corresponding to said current amplification unit 20, the source of the transistor a is connected to the clock signal terminal CLK2, the source of the transistor c is connected to the clock signal terminal CLK1. With above configuration, the number of clock signal terminals can be reduced, thereby the area occupied by the gate driving circuit is reduced and the aperture ratio of the display device can be improved.

Figure 3:
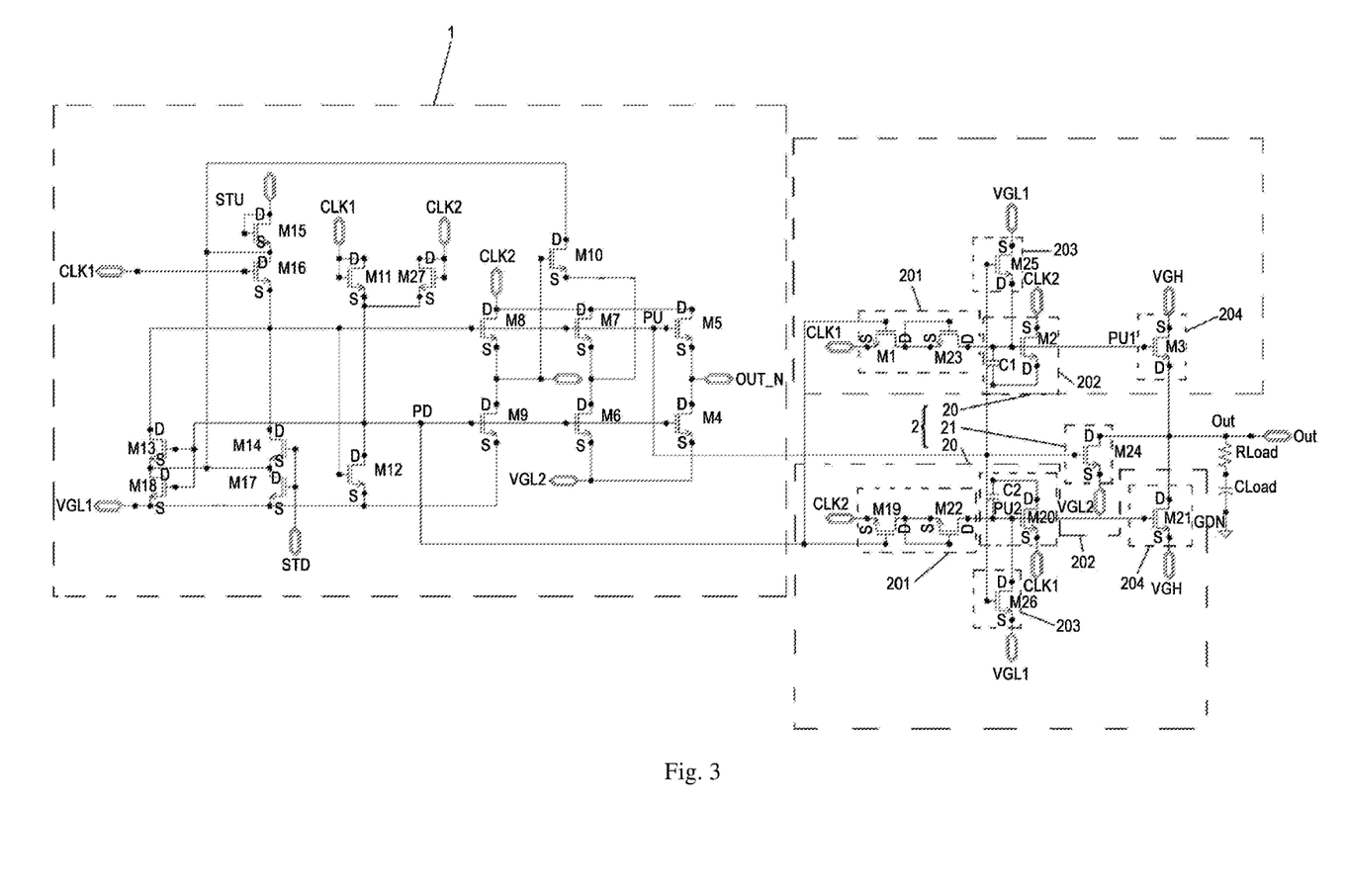
FIG. 3 is a circuit diagram of the gate driving circuit shown in FIG. 1.

In the present embodiment, the number of the current amplification units 20 may be two. In this case, the circuit diagram of the inverter 2 is shown in FIG. 3. Specifically, in a first current amplification unit 20, the pull-up module 201 comprises the first transistor M1 and the twenty-third transistor M23; the gate of the first transistor M1 is connected to the first signal INPUT_NOT, the source is connected to the first clock signal terminal CLK1, and the drain is connected with the gate and the source of the twenty-third transistor M23; the drain of the twenty-third transistor M23 is connected with the pull-up hold module 202 and the gate of the third transistor M3 in the first current amplification unit 20, wherein the third transistor M3 is the driving transistor 204 in the current amplification unit 20; that is, the first transistor M1 is the transistor a in the current amplification unit 20, the twenty-third transistor M23 is the transistor b in the current amplification unit 20. The pull-up hold module 202 comprises the second transistor M2 and the first capacitor C1; the gate of the second transistor M2 is connected to the drain of the twenty-third transistor M23, the source is connected to the second clock signal terminal CLK2, and the drain is connected to a first terminal of the first capacitor C1; the second terminal of the first capacitor C1 is connected between the drain of the twenty-third transistor M23 and the gate of the second transistor M2, that is, the second transistor M2 is the transistor c in the current amplification unit 20, and the first capacitor C1 is the capacitor C in the current amplification unit 20; wherein the level of the second clock signal terminal CLK2 is opposite to the level of the first clock signal terminal CLK1, i.e. when the first clock signal terminal CLK1 provides low level, the second clock signal terminal CLK2 provides high level, and when the first clock signal terminal CLK1 provides high level, the second clock signal terminal CLK2 provides low level. In the first current amplification unit 20, the internal pull-down module 203 comprises a twenty-fifth transistor M25; the gate of the twenty-fifth transistor M25 is connected to the second signal INPUT, the source is connected to a first low voltage terminal VGL1, and the drain is connected between the second terminal of the first capacitor C1 and the gate of the second transistor M2, that is, the twenty-fifth transistor M25 is the transistor d in the current amplification unit 20.

In a second current amplification unit 20, the pull-up module 201 comprises the nineteenth transistor M19 and the twenty-second transistor M22; the gate of the nineteenth transistor M19 is connected to the first signal INPUT_NOT, the source is connected to the second clock signal terminal CLK2, and the drain is connected with the gate and the source of the twenty-second transistor M22; the drain of the twenty-second transistor M22 is connected with the pull-up hold module 202 in the second current amplification unit 20 and the gate of the twenty-first transistor M21, wherein the twenty-first transistor M21 is the driving transistor 204 in the current amplification unit 20; that is, the nineteenth transistor M19 is the transistor a in the current amplification unit 20, the twenty-second transistor M22 is the transistor b in the current amplification unit 20. The pull-up hold module 202 comprises the twentieth transistor M20 and the second capacitor C2; the gate of the twentieth transistor M20 is connected to the drain of the twenty-second transistor M22, the source is connected to the first clock signal terminal CLK1, and the drain is connected to a first terminal of the second capacitor C2; the second terminal of the second capacitor C2 is connected between the drain of the twenty-second transistor M22 and the gate of the twentieth transistor M20, that is, the twentieth transistor M20 is the transistor c in the current amplification unit 20, and the second capacitor C2 is the capacitor C in the current amplification unit 20. The internal pull-down module 203 comprises a twenty-sixth transistor M26; the gate of the twenty-sixth transistor M26 is connected to the second signal INPUT, the source is connected to a first low voltage terminal VGL1, and the drain is connected between the second terminal of the second capacitor C2 and the gate of the twentieth transistor M20, that is, the twenty-sixth transistor M26 is the transistor d in the current amplification unit 20.

The external pull-down module 21 comprises a twenty-fourth transistor M24; the gate of the twenty-fourth transistor M24 is connected to the second signal INPUT, the source is connected to a second low voltage terminal VGL2, and the drain is connected to the output terminal OUT, that is, the twenty-fourth transistor M24 is the transistor e in the inverter 2.

FIG. 3 also shows the circuit configuration of the shift register 1. The circuit configuration of the shift register 1 in the present embodiment is shown in FIG. 3. In this case, the shift register 1 specifically comprises a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, a fifteenth transistor M15, a sixteenth transistor M16, a seventeenth transistor M17, an eighteenth transistor M18, a twenty-seventh transistor M27 and a self-lift capacitor C3; the gate and source of the fifteenth transistor M15 are connected with a first control voltage terminal STU, the drain of the fifteenth transistor M15 is connected with the source of the sixteenth transistor M16; the gate of the sixteenth transistor M16 is connected with the first clock signal terminal CLK1, the drain of the sixteenth transistor M16 is connected with the pull-up node PU; the gate and source of the eleventh transistor M11 are connected with the first clock signal terminal CLK1, the drain of the eleventh transistor M11 is connected with the pull-down node PD; the gate and source of the twenty-seventh transistor M27 are connected with the second clock signal terminal CLK2, the drain of the twenty-seventh transistor M27 is connected with the pull-down node PD; the gate of the eighteenth transistor M18 is connected with the pull-down node PD, the source of the eighteenth transistor M18 is connected with the first low voltage terminal VGL1, the drain of the eighteenth transistor M18 is connected with the source of the thirteenth transistor M13; the gate of the thirteenth transistor M13 is connected with the pull-down node PD, the drain of the thirteenth transistor M13 is connected with the pull-up node PU; the gate of the seventeenth transistor M17 is connected with a second control voltage terminal STD, the source of the seventeenth transistor M17 is connected with the first low voltage terminal VGL1, the drain of the seventeenth transistor M17 is connected with the source of the fourteenth transistor M14; the gate of the fourteenth transistor M14 is connected with the second control voltage terminal STD, the drain of the fourteenth transistor M14 is connected with the pull-up node PU; the gate of the twelfth transistor M12 is connected with the pull-up node PU, the source of the twelfth transistor M12 is connected with the first low voltage terminal VGL1, the drain of the twelfth transistor M12 is connected with the pull-down node PD; the gate of the eighth transistor M8 is connected with the pull-up node PU, the source of the eighth transistor M8 is connected with the second clock signal terminal CLK2, and the drain of the eighth transistor M8 is connected with the gate of the tenth transistor M10; the gate of the ninth transistor M9 is connected with the pull-down node PD, the source of the ninth transistor M9 is connected with the first low voltage terminal VGL1, and the drain of the ninth transistor M9 is connected with the gate of the tenth transistor M10; the gate of the seventh transistor M7 is connected with the pull-up node PU, the source of the seventh transistor M7 is connected with the second clock signal terminal CLK2, and the drain of the seventh transistor M7 is connected with the source of the tenth transistor M10; the gate of the sixth transistor M6 is connected with the pull-down node PD, the source of the sixth transistor M6 is connected with the second low voltage terminal VGL2, and the drain of the sixth transistor M6 is connected with the source of the tenth transistor M10; the gate of the fifth transistor M5 is connected with the pull-up node PU, the source of the fifth transistor M5 is connected with the second clock signal terminal CLK2; the gate of the fourth transistor M4 is connected with the pull-down node PD, the source of the fourth transistor M4 is connected with the second low voltage terminal VGL2; the drain of the tenth transistor M10 is connected between the drain of the eighteenth transistor M18 and the source of the thirteenth transistor M13, and also between the drain of the seventeenth transistor M17 and the source of the fourteenth transistor M14; a first terminal of the self-lift capacitor C3 is connected to the pull-up node PU, the second terminal of the self-lift capacitor C3 is connected to the drain of the twenty-seventh transistor M27.

In addition, the shift register 1 may also include an output terminal OUT_N, in this case, the drain of the fourth transistor M4 and the drain of the fifth transistor M5 are connected to the output terminal OUT_N of the shift register 1, and the output terminal OUT_N is empty, that is the output terminal OUT_N is not connected with the light emitting device.

In the circuit shown in FIG. 3, a first clock signal terminal CLK1 and a second clock signal terminal CLK2 are provided in both the shift register 1 and the inverter 2, wherein the first clock signal terminal CLK1 and the second clock signal terminal CLK2 may be a same signal terminal or separate signal terminals for different requirements.

In the present embodiment, the transistors in the shift register 1 and the inverter 2 may be N-type thin film transistors. N-type thin film transistor is widely used in display device and particularly in the oxide semiconductor display device (display device in which the active layer of the thin film transistor is oxide), thereby the cost of the gate driving circuit and display device can be reduced.

Take a case where the shift register 1 and the inverter 2 have the structure shown in FIGS. 2 and 3 respectively, and the thin film transistors are N-type thin film transistors as an example, with reference to the timing sequence shown in FIG. 4, the principles and procedures of the gate driving circuit of the present invention in generating light emitting signals and driving the light emitting device to emit light will be described in detail.

Figure 4:
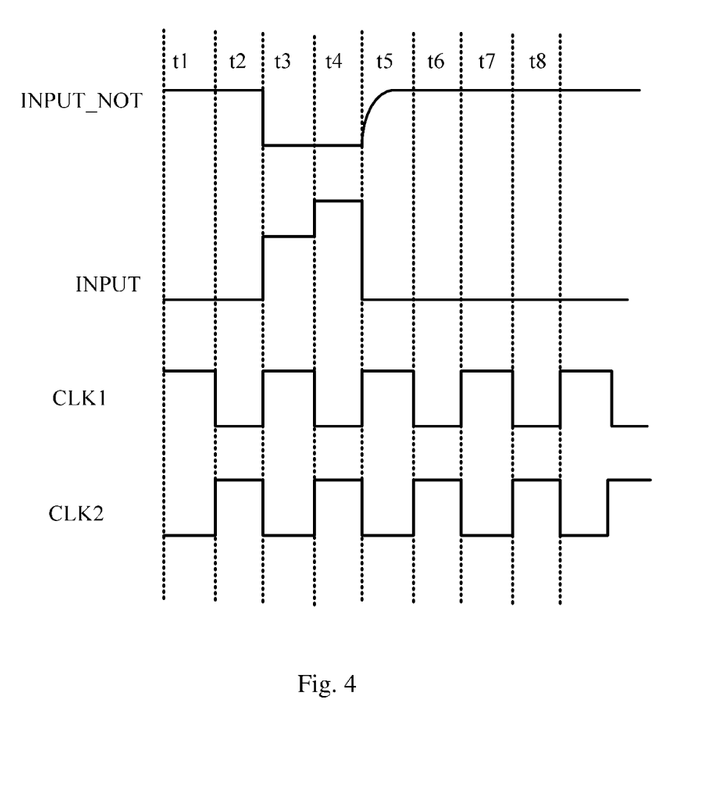
FIG. 4 is a timing chart of respective signals in the gate driving circuit shown in FIG. 3.

Firstly, the shift register 1 generates the first signal INPUT_NOT and the second signal INPUT, timing sequences of the generated first signal INPUT_NOT and the second signal INPUT are shown in FIG. 4. Using the shift register to generate required signals is existing technology, thus the principle and detailed procedure of generating the first signal INPUT_NOT and the second signal INPUT by the shift register 1 will be omitted. Further, the shift register 1 is not limited to the present embodiment, but can be any suitable circuit configuration capable of providing the first signal INPUT_NOT and the second signal INPUT to the inverter 2.

As to the inverter 2, in a first period t1, the shift register 1 provides the first signal INPUT_NOT with high level and the second signal INPUT with low level; the first clock signal terminal CLK1 outputs high level, the second clock signal terminal CLK2 outputs low level. Since the first signal INPUT_NOT is high level, the first transistor M1 is turned on, thereby the high level signal output from the first clock signal terminal CLK1 turns on the twenty-third transistor M23. Meanwhile, the high level output from the first clock signal terminal CLK1 is also input to the gates of the second transistor M2 and the third transistor M3, so that the second transistor M2 and the third transistor M3 are turned on, and the second terminal of the first capacitor C1 is charged; by turning on the second transistor M2, the low level signal output from the second clock signal terminal CLK2 is input to the first terminal of the second capacitor C2, and by turning on the third transistor M3, the high voltage terminal VGH is connected via the third transistor M3 to the output terminal OUT.

Since the first signal INPUT_NOT is high level, the nineteenth transistor M19 is turned on, so that the low level signal output from the second clock signal terminal CLK2 turns off the twenty-second transistor M22; in this case, the second terminal of the second capacitor C2 is charged to high level in the preceding period, therefore the second capacitor C2 will keep the gates of the twentieth transistor M20 and the twenty-first transistor M21 at high level during this period, so that the twentieth transistor M20 and the twenty-first transistor M21 are turned on. Since the twentieth transistor M20 is turned on, the high level signal output from the first clock signal terminal CLK1 charges the first terminal of the second capacitor C2, the voltage on the second terminal of the second capacitor C2 will be self-lifted, such that the twentieth transistor M20 and the twenty-first transistor M21 are sufficiently turned on, also the voltage difference between the gate and source of the twenty-first transistor M21 will be enlarged and large current signal can be generated. By turning on the twenty-first transistor M21, the high voltage terminal VGH is connected to the output terminal OUT via the twenty-first transistor M21.

As above, in the first period, the inverter 2 outputs high level signal.

In the second period t2, the shift register 1 provides the first signal INPUT_NOT with high level and the second signal INPUT with low level; the first clock signal terminal CLK1 outputs low level, the second clock signal terminal CLK2 outputs high level. In this case, the first transistor M1 is turned on, the twenty-third transistor M23 is turned off. Since the second capacitor C2 is charged in the first period, the gate of the second transistor M2 will be kept at high level, the second transistor M2 and the third transistor M3 are kept in a turning on status. Since the second transistor M2 is turned on, the high level signal output from the second clock signal terminal CLK2 charges the first terminal of the first capacitor C1, thereby the voltage on the second terminal of the first capacitor C1 is self-lifted, such that the second transistor M2 and the third transistor M3 are sufficiently turned on, also the voltage difference between the gate and source of the third transistor M3 will be enlarged and large current signal can be generated. By turning on the third transistor M3, the high voltage terminal VGH is connected to the output terminal OUT via the third transistor M3. On the other hand, the nineteenth transistor M19 is also turned on, so that the twenty-second transistor M22, the twentieth transistor M20 and the twenty-first transistor M21 are turned on, the high voltage terminal VGH is also connected to the output terminal OUT via the twenty-first transistor M21. Thus, in the second period, the inverter 2 outputs high level signal.

In a third period t3, the shift register 1 provides the first signal INPUT_NOT with low level and the second signal INPUT with high level; the first clock signal terminal CLK1 outputs high level, the second clock signal terminal CLK2 outputs low level. The first transistor M1 and the nineteenth transistor M19 are turned off, that is, the pull-up modules 201 of the two current amplification units 20 do not work. The twenty-fourth transistor M24, the twenty-fifth transistor M25 and the twenty-sixth transistor M26 are turned on. In this case, the first low voltage terminal VGL1 pulls-down the potential on the first capacitor C1 and the second capacitor C2, the second low voltage terminal VGL2 outputs low voltage to the output terminal OUT. Thus, in the third period, the inverter 2 outputs low level signal.

In a fourth period t4, the shift register 1 provides the first signal INPUT_NOT with low level and the second signal INPUT with high level; the first clock signal terminal CLK1 outputs low level, the second clock signal terminal CLK2 outputs high level. Like the third period t3, the first transistor M1 and the nineteenth transistor M19 are turned off, the twenty-fourth transistor M24, the twenty-fifth transistor M25 and the twenty-sixth transistor M26 are turned on. In this case, the first low voltage terminal VGL1 pulls-down the potential on the first capacitor C1 and the second capacitor C2, the second low voltage terminal VGL2 outputs low voltage to the output terminal OUT. Thus, in this period, the inverter 2 outputs low level signal.

In a fifth period t5, the shift register 1 provides the first signal INPUT_NOT with high level and the second signal INPUT with low level; the first clock signal terminal CLK1 outputs high level, the second clock signal terminal CLK2 outputs low level. In this period, the first transistor M1 and the twenty-third transistor M23 are turned on, the high level signal output from the first clock signal terminal CLK1 is input to the second transistor M2 and the third transistor M3, the second terminal of the first capacitor C1 is charged. By turning on the third transistor M3, the high voltage terminal VGH is connected to the output terminal OUT via the third transistor M3. Thus, in this period, the inverter 2 outputs high level signal.

In the sixth period t6, the shift register 1 provides the first signal INPUT_NOT with high level and the second signal INPUT with low level; the first clock signal terminal CLK1 outputs low level, the second clock signal terminal CLK2 outputs high level. In this period, the first transistor M1 is turned on, the twenty-third transistor M23 is turned off by low level from the first clock signal terminal CLK1. However, since the second terminal of the first capacitor C1 is charged to high level in the preceding period, the second transistor M2 and the third transistor M3 will be turned on by the first capacitor C1. By turning on the second transistor M2, the first terminal of the first capacitor C1 is charged by the high level from the second clock signal terminal CLK2, thereby voltage on the second terminal of the first capacitor C1 will be self-lifted, the second transistor M2 and the third transistor M3 are sufficiently turned on, the voltage difference between the gate and source of the third transistor M3 will be enlarged and large current signal can be generated. By turning on the third transistor M3, the high voltage terminal VGH is connected to the output terminal OUT via the third transistor M3. Thus, in this period, the inverter 2 outputs high level signal.

The seventh period t7 and the eighth period t8 are similar to the first period t1 and the second period t2, the details are omitted here.

Figure 5:
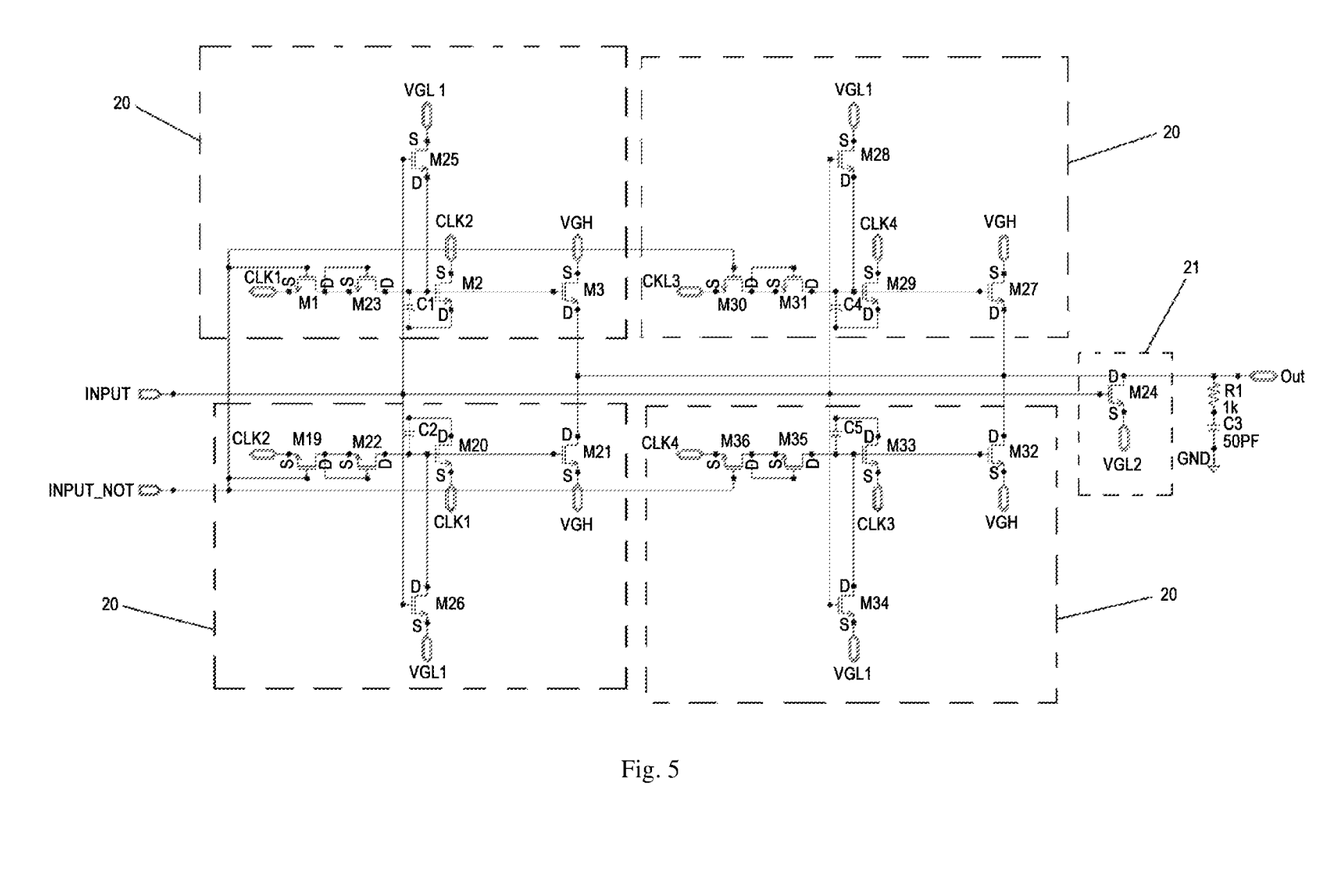
FIG. 5 is a circuit diagram of an inverter including four current amplification units.

From above, in two adjacent periods (except t2-t3, t3-t4, t4-t5), the second terminal of the first capacitor C1 is charged to high level by the first clock signal terminal CLK1 in the preceding period, then in the next period, the first terminal of the first capacitor C1 is charged by the second clock signal terminal CLK2, thereby voltage on the second terminal of the first capacitor C1 will be self-lifted. As shown in FIG. 5, the voltage on the second terminal of the first capacitor C1 is higher than VGH and high level on the first clock signal terminal CLK1, thus the third transistor M3 are sufficiently turned on, the connection between the high voltage terminal VGH and the output terminal OUT is stabilized. Therefore, voltage difference between the gate and source of the third transistor M3 will be enlarged, large current signal can be generated and input to the light emitting device via the output terminal, so as to drive the light emitting device to emit light.

Note that when signals are delivered in the signal lines, parasitic resistance and parasitic capacitance exist in the signal lines, resulting in signal delay. Moreover, when delivered through transistors, the signals will also be delayed. In view of above, in the present embodiment, the first signal INPUT_NOT and the second signal INPUT, and the first clock signal terminal CLK1 and the second clock signal terminal CLK2 will be delayed, that is, the rising edge, falling edge of the first signal INPUT_NOT and the second signal INPUT, and the first clock signal terminal CLK1 and the second clock signal terminal CLK2 will be elongated. In this case, when the number of the current amplification units 20 is two, at the level switching timing of each clock signal, the inverter cannot produce stable light emitting signal or outputs abnormal signals, resulting in display abnormality of the OLED display device.

Figure 6:
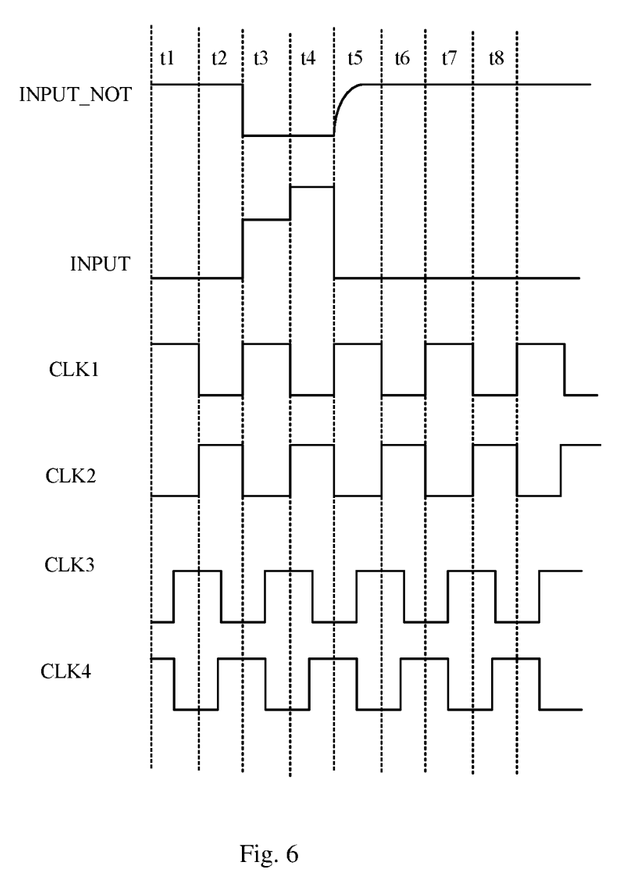
FIG. 6 is a timing chart of respective signals in the inverter shown in FIG. 5.

When the inverter 2 has more current amplification units 20, when the level of clock signal corresponding to two current amplification units 20 in a group is switched, the clock signal corresponding to other current amplification units 20 can be kept at certain level, that is, the switching timing of clock signals corresponding to different groups of current amplification units 20 are interleaved, so that when the current amplification units 20 in one group produce abnormal light emitting signal due to delay of the clock signal, the other current amplification units 20 produce light emitting signal normally, thereby the light emitting signal output from the output terminal OUT is stabilized. For example, when the number of the current amplification units 20 is four, the circuit configuration of the inverter 2 is shown in FIG. 5, the clock signals are CLK1-CLK4, the timing sequence of the first signal INPUT_NOT and the second signal INPUT is shown in FIG. 6. It can be seen that the level switching timing of the clock signals CLK1 and CLK3 are interleaved, the level switching timing of the clock signals CLK2 and CLK4 are interleaved, the operation procedure of each current amplification unit 20 is described above and is not repeated here.

In above embodiment, the principle and procedure of the gate driving circuit generating current for driving the light emitting device are discussed taking an even number of the current amplification units in the inverter 2 as example. However, in the present embodiment, the number of current amplification units 20 in the inverter 2 can also be odd (and larger than two). Similar to above embodiment in which an even number (and larger than two) of current amplification units are provided, in the odd number of current amplification units 20, a part of the current amplification units forms at least one group comprising current amplification units corresponding to each other, the number of this part of current amplification units is an even number larger than two, which is used for generating current to drive the light emitting device. As to the other part of current amplification units, the clock signals thereof are interleaved in the level switching timing from the clock signals of the first part of current amplification units, this part of current amplification units are used to compensate the delay in the first signal INPUT_NOT, the second signal INPUT and the clock signal for the first part of current amplification units 20. When the first part of current amplification units 20 produce abnormal light emitting signals, the other part of current amplification units 20 produce normal light emitting signals, so that the light emitting signals output from the output terminal OUT are stabilized.

In the gate driving circuit of the present embodiment, each stage shift register 1 is connected with an inverter 2, the inverter 2 generates light emitting signals according to the first signal and the second signal provided by the shift register 1, to drive the light emitting device to emit light. During this procedure, AC power supply signal can be adopted to compensate the threshold voltage of the driving transistor. Compared to existing solutions, the number of required thin film transistors and/or capacitors is reduced, and the aperture ratio of the display device is improved. Furthermore, since high level and large current is input to the light emitting device by the gate driving circuit of the present invention, output with high voltage and large current can be provided.

The present invention also provides an OLED display device comprising the gate driving circuit in above embodiment.

According to the OLED display device of the present invention which comprises the gate driving circuit in above embodiment, compared to existing solutions, the number of required thin film transistors and/or capacitors is reduced, and the aperture ratio of the display device is improved. Furthermore, output with high voltage and large current can be provided.

It can be understood that the above implementations are merely exemplary implementations adopted for describing the principle of the present invention, but the present invention is not limited thereto. For a person of ordinary skill in the art, various variations and improvements may be made without departing from the spirit and essence of the present invention, and those variations and improvements should also be regarded as falling into the protection scope of the present invention.

The invention claimed is:

1. A gate driving circuit, comprising multiple stages of shift registers, wherein:
    each stage of shift register is connected to an inverter and is configured to provide a first signal and a second signal for the inverter, when the first signal is high level, the second signal is low level, and when the first signal is low level, the second signal is high level;
    the inverter receives the first signal and the second signal, an output terminal of the inverter is connected to an anode of a light emitting device, the inverter is configured to generate a light emitting signal according to the first signal and the second signal and input the light emitting signal to the light emitting device, so as to drive the light emitting device to emit light;
    the inverter comprises at least two current amplification units and an external pull-down unit;
    each current amplification unit comprises a pull-up module, a pull-up hold module, an internal pull-down module and a driving transistor;
    within each current amplification unit, the pull-up module and the pull-up hold module are connected to a gate of the driving transistor, the pull-up module receives the first signal and is configured for pulling up potential of the light emitting signal; the pull-up hold module is connected to the gate of the driving transistor, and is configured for holding potential of the light emitting signal at a pulled-up state; the internal pull-down module is connected to the gate of the driving transistor, the internal pull-down module receives the second signal and is configured for pulling down potential of the pull-up hold module; a source of the driving transistor is connected to a high voltage terminal, and a drain of the driving transistor is connected to the output terminal of the inverter;
    the external pull-down unit is connected to the output terminal of the inverter, the external pull-down unit receives the second signal and is configured for pulling down potential of the light emitting signal.

2. The gate driving circuit of claim 1, wherein each current amplification unit is connected with a pull-up node and a pull-down node of the corresponding stage of shift register, the external pull-down unit is connected to the pull-up node of the corresponding stage of shift register;
    the first signal is supplied to the current amplification unit through the pull-down node, the second signal is supplied to the current amplification unit and the external pull-down unit through the pull-up node.

3. The gate driving circuit of claim 1, wherein in the inverter, the number of the current amplification units is an even number, every two current amplification units correspond to each other.

4. The gate driving circuit of claim 3, wherein:
    in each current amplification unit, the pull-up module comprises transistors a and b;
    a gate of the transistor a is connected to the first signal, a source of the transistor a is connected to a clock signal terminal, a drain of the transistor a is connected to a gate and a source of the transistor b;
    a drain of the transistor b is connected with the pull-up hold module in the current amplification unit and the gate of the driving transistor;
    in two current amplification units corresponding to each other, the sources of transistors a are connected to different clock signal terminals, and when one clock signal terminal provides low level, the other clock signal terminal provides high level.

5. The gate driving circuit of claim 4, wherein:
    in each current amplification unit, the pull-up hold module comprises a transistor c and a capacitor C;
    a gate of the transistor c is connected to the drain of the transistor b, a source of the transistor c is connected to a clock signal terminal, and a drain of the transistor c is connected to a first terminal of the capacitor C;
    a second terminal of the capacitor C is connected between the drain of the transistor b and the gate of the transistor c;
    in each current amplification unit, the clock signal terminal connected with the source of the transistor c is different from the clock signal terminal connected with the source of the transistor a, and when one of the clock signal terminal connected with the source of the transistor c and the clock signal terminal connected with the source of the transistor a provides low level, the other of the clock signal terminal connected with the source of the transistor c and the clock signal terminal connected with the source of the transistor a provides high level.

6. The gate driving circuit of claim 5, wherein:
in each current amplification unit, the internal pull-down module comprises a transistor d;
a gate of the transistor d is connected to the second signal, a source of the transistor d is connected to a low voltage terminal, and a drain of the transistor d is connected between the gate of the transistor c and the second terminal of the capacitor C.

7. The gate driving circuit of claim 5, wherein in every two current amplification units corresponding to each other, the clock signal terminal connected to the source of the transistor a in one current amplification unit is the same as the clock signal terminal connected to the source of the transistor c in the other current amplification unit.

8. The gate driving circuit of claim 1, wherein in the inverter, the number of the current amplification units is an odd number, wherein at least two current amplification units correspond to each other.

9. The gate driving circuit of claim 8, wherein:
in each current amplification unit, the pull-up module comprises transistors a and b;
a gate of the transistor a is connected to the first signal, a source of the transistor a is connected to a clock signal terminal, a drain of the transistor a is connected to a gate and a source of the transistor b;
a drain of the transistor b is connected with the pull-up hold module in the current amplification unit and the gate of the driving transistor;
in two current amplification units corresponding to each other, the sources of transistors a are connected to different clock signal terminals, and when one clock signal terminal provides low level, the other clock signal terminal provides high level.

10. The gate driving circuit of claim 9, wherein:
in each current amplification unit, the pull-up hold module comprises a transistor c and a capacitor C;
a gate of the transistor c is connected to the drain of the transistor b, a source of the transistor c is connected to a clock signal terminal, and a drain of the transistor c is connected to a first terminal of the capacitor C;
a second terminal of the capacitor C is connected between the drain of the transistor b and the gate of the transistor c;
in each current amplification unit, the clock signal terminal connected with the source of the transistor c is different from the clock signal terminal connected with the source of the transistor a, and when one of the clock signal terminal connected with the source of the transistor c and the clock signal terminal connected with the source of the transistor a provides low level, the other of the clock signal terminal connected with the source of the transistor c and the clock signal terminal connected with the source of the transistor a provides high level.

11. The gate driving circuit of claim 10, wherein:
in each current amplification unit, the internal pull-down module comprises a transistor d;
a gate of the transistor d is connected to the second signal, a source of the transistor d is connected to a low voltage terminal, and a drain of the transistor d is connected between the gate of the transistor c and the second terminal of the capacitor C.

12. The gate driving circuit of claim 10, wherein in every two current amplification units corresponding to each other, the clock signal terminal connected to the source of the transistor a in one current amplification unit is the same as the clock signal terminal connected to the source of the transistor c in the other current amplification unit.

13. The gate driving circuit of claim 1, wherein:
the external pull-down unit comprises a transistor e;
a gate of the transistor e is connected to the second signal, a source of the transistor e is connected to a low voltage terminal, a drain of the transistor e is connected to the output terminal of the inverter.

14. The gate driving circuit of claim 13, wherein all of the transistors are N-type thin film transistors.

15. The gate driving circuit of claim 1, wherein the number of the current amplification units in the inverter is two.

16. The gate driving circuit of claim 1, wherein the number of the current amplification units in the inverter is four.

17. The gate driving circuit of claim 1, wherein all of the transistors are N-type thin film transistors.

18. The gate driving circuit of claim 1, wherein:
each stage of shift register comprises a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor, an eighteenth transistor, a twenty-seventh transistor and a bootstrap capacitor;
a gate and a source of the fifteenth transistor are connected with a first control voltage terminal, a drain of the fifteenth transistor is connected with a source of the sixteenth transistor;
a gate of the sixteenth transistor is connected with a first clock signal terminal, a drain of the sixteenth transistor is connected with a pull-up node;
a gate and a source of the eleventh transistor are connected with the first clock signal terminal, a drain of the eleventh transistor is connected with a pull-down node;
a gate and a source of the twenty-seventh transistor are connected with a second clock signal terminal, a drain of the twenty-seventh transistor is connected with the pull-down node;
a gate of the eighteenth transistor is connected with the pull-down node, a source of the eighteenth transistor is connected with a first low voltage terminal, a drain of the eighteenth transistor is connected with a source of the thirteenth transistor,
a gate of the thirteenth transistor is connected with the pull-down node, a drain of the thirteenth transistor is connected with the pull-up node;
a gate of the seventeenth transistor is connected with a second control voltage terminal, a source of the seventeenth transistor is connected with the first low voltage terminal, a drain of the seventeenth transistor is connected with a source of the fourteenth transistor;
a gate of the fourteenth transistor is connected with the second control voltage terminal, a drain of the fourteenth transistor is connected with the pull-up node;
a gate of the twelfth transistor is connected with the pull-up node, a source of the twelfth transistor is connected with the first low voltage terminal, a drain of the twelfth transistor is connected with the pull-down node;

a gate of the eighth transistor is connected with the pull-up node, a source of the eighth transistor is connected with the second clock signal terminal, and a drain of the eighth transistor is connected with a gate of the tenth transistor;

a gate of the ninth transistor is connected with the pull-down node, a source of the ninth transistor is connected with the first low voltage terminal, and a drain of the ninth transistor is connected with the gate of the tenth transistor;

a gate of the seventh transistor is connected with the pull-up node, a source of the seventh transistor is connected with the second clock signal terminal, and a drain of the seventh transistor is connected with a source of the tenth transistor;

a gate of the sixth transistor is connected with the pull-down node, a source of the sixth transistor is connected with a second low voltage terminal, and a drain of the sixth transistor is connected with the source of the tenth transistor;

a gate of the fifth transistor is connected with the pull-up node, a source of the fifth transistor is connected with the second clock signal terminal;

a gate of the fourth transistor is connected with the pull-down node, a source of the fourth transistor is connected with the second low voltage terminal;

a drain of the tenth transistor is connected between the drain of the eighteenth transistor and the source of the thirteenth transistor, and also between the drain of the seventeenth transistor and the source of the fourteenth transistor;

a first terminal of the bootstrap capacitor is connected to the pull-up node, a second terminal of the bootstrap capacitor is connected to the drain of the twenty-seventh transistor.

19. The gate driving circuit of claim 18, wherein each stage of shift register further comprises an output terminal which is connected with the drain of the fourth transistor and the drain of the fifth transistor and is not connected with the light emitting device.

20. An OLED display device comprising the gate driving circuit in claim 1.

* * * * *